United States Patent
Arana et al.

(10) Patent No.: US 7,402,515 B2
(45) Date of Patent: Jul. 22, 2008

(54) METHOD OF FORMING THROUGH-SILICON VIAS WITH STRESS BUFFER COLLARS AND RESULTING DEVICES

(75) Inventors: Leonel R. Arana, Phoenix, AZ (US); Devendra Natekar, Chandler, AZ (US); Michael Newman, Gilbert, AZ (US); Charan K. Gurumurthy, Higley, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/169,595

(22) Filed: Jun. 28, 2005

(65) Prior Publication Data

US 2006/0290002 A1    Dec. 28, 2006

(51) Int. Cl.
*H01L 21/4763* (2006.01)
*H01L 21/44* (2006.01)

(52) U.S. Cl. .............. 438/639; 438/624; 438/629; 438/667; 438/672; 257/774; 257/E21.577

(58) Field of Classification Search .............. 438/623, 438/624, 629, 639, 667, 672; 257/774, E21.577
See application file for complete search history.

(56) References Cited

U.S. PATENT DOCUMENTS

| | | | |
|---|---|---|---|
| 4,791,248 A | 12/1988 | Oldenettel | |
| 6,358,836 B1 * | 3/2002 | Lu et al. | 438/618 |
| 6,831,363 B2 * | 12/2004 | Dalton et al. | 257/751 |
| 6,962,865 B2 | 11/2005 | Hanaoka et al. | |
| 7,276,787 B2 | 10/2007 | Edelstein et al. | |
| 2001/0051393 A1 * | 12/2001 | Ogino et al. | 438/106 |
| 2002/0155661 A1 * | 10/2002 | Massingill et al. | 438/244 |
| 2003/0104649 A1 * | 6/2003 | Ozgur et al. | 438/50 |
| 2005/0121768 A1 * | 6/2005 | Edelstein et al. | 257/698 |
| 2005/0153505 A1 * | 7/2005 | Gambino et al. | 438/233 |

FOREIGN PATENT DOCUMENTS

| | | |
|---|---|---|
| JP | 3050781 | 3/1991 |
| WO | 9833214 A1 | 7/1998 |

OTHER PUBLICATIONS

PCT/US2006/025471, PCT Search Report Dated: Nov. 23, 2006, 13 pages.

* cited by examiner

*Primary Examiner*—Nitin Parekh

(57) ABSTRACT

A method of forming a via having a stress buffer collar, wherein the stress buffer collar can absorb stress resulting from a mismatch in the coefficients of thermal expansion of the surrounding materials. Other embodiments are described and claimed.

22 Claims, 7 Drawing Sheets

METHOD OF FORMING THROUGH-SILICON VIAS WITH STRESS BUFFER COLLARS AND RESULTING DEVICES

FIELD OF THE INVENTION

The disclosed embodiments relate generally to the fabrication of integrated circuit devices and, more specifically, to the formation of through-silicon vias with stress buffer collars.

BACKGROUND OF THE INVENTION

Vias are routinely used structures in the construction of integrated circuit (IC) devices. By way of example, vias may be used to form electrical connections between various layers of conductors in the interconnect structure of an IC die. By way of further example, vias may also be formed that extend from the backside of an IC die to the active or front side, such vias often referred to as "through-silicon vias." Through-silicon vias can, for example, be used to form backside interconnects for a pair of bonded wafers, the bonded wafers forming a wafer stack that is ultimately cut into a number of stacked die. In addition, through-silicon vias may also find use in MEMS (Micro-Electromechanical Systems) devices.

Through-silicon vias may be filled with copper or other conductive material to provide for an electrical connection to a circuit from the backside of a die (or wafer). Copper, as well as other conductive metals, has a higher coefficient of thermal expansion (CTE) than silicon. For example, copper has a CTE of approximately 16.5 ppm/° C., whereas silicon has a CTE of approximately 2.6 ppm/° C. This CTE mismatch may result in significant stress in the silicon and copper (or other conductive material) after copper deposition, as well as during any subsequent temperature cycling (e.g., as may occur during solder reflow, during testing, or during use). In addition, when vias are spaced relatively close together such that their stress fields interact, these stresses may be further magnified. The stresses that may result from the above-described CTE mismatch can lead to numerous problems, including thin-film delamination, cracking of the silicon, and reduced transistor performance (any of which may lead to lower yields and reliability failures).

A number of solutions have been proposed to alleviate the effects of CTE mismatches in conductive-filled through-silicon vias. One solution is to make the diameter of the vias smaller in order to reduce the stress from each individual via. Another solution is to position vias far apart from one another to limit the interaction of the stress fields between adjacent vias. A further solution is to position vias far from any active circuitry to ensure stress fields do not penetrate the area proximate the active circuitry. Should the via stress fields penetrate the regions near active circuitry, carrier mobility may be reduced and transistor performance degraded.

DETAILED DESCRIPTION OF THE INVENTION

Figure 1:
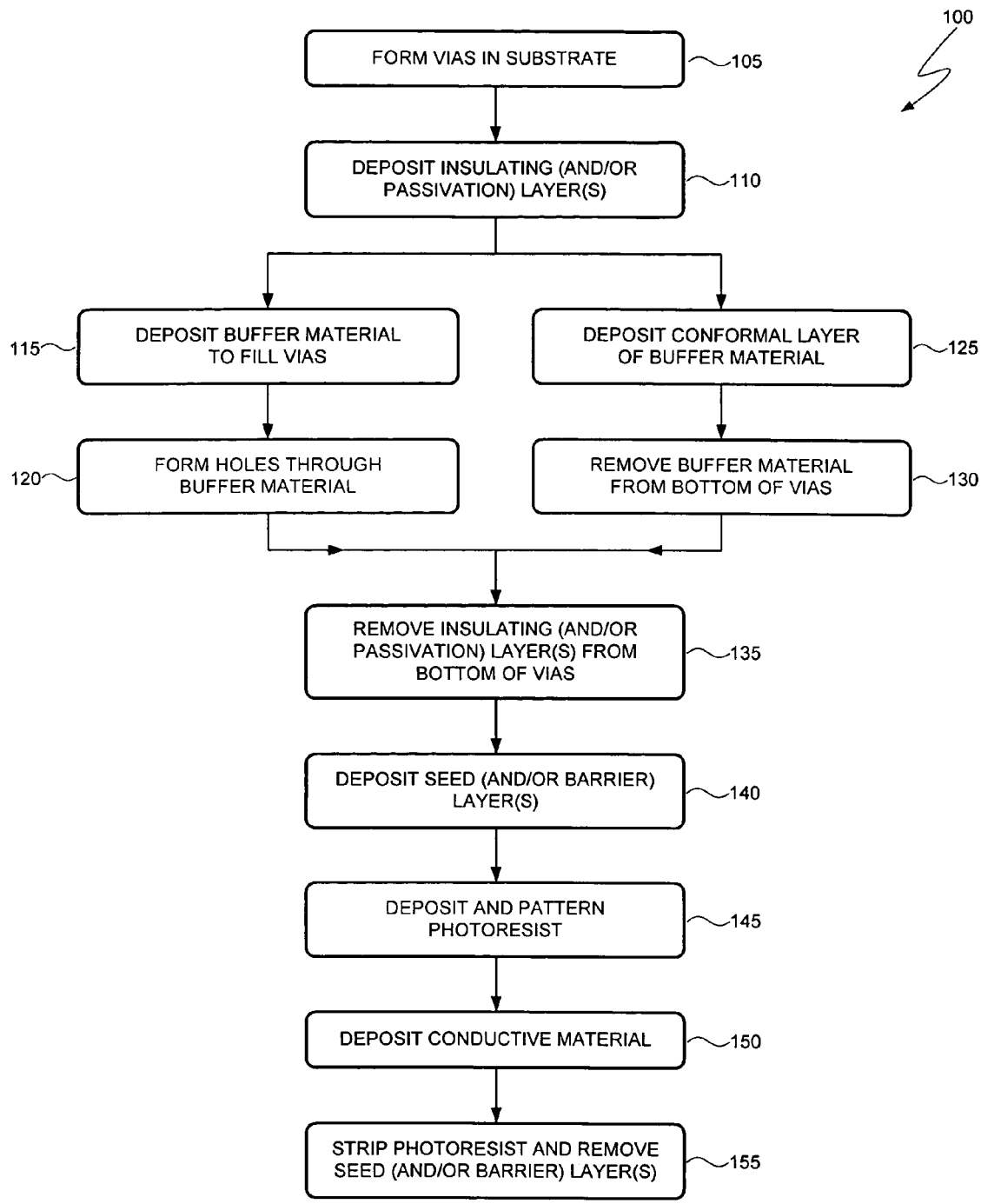
FIG. 1 is a block diagram illustrating an embodiment of a method of forming vias having stress buffer collars.

Turning now to FIG. 1, illustrated is an embodiment of a method 100 of forming a via having a stress buffer collar. Embodiments of the method 100 shown in FIG. 1 are further illustrated in the schematic diagrams of FIGS. 2A through 2L, and reference should be made to these figures as called out in the text below.

Figure 2A:
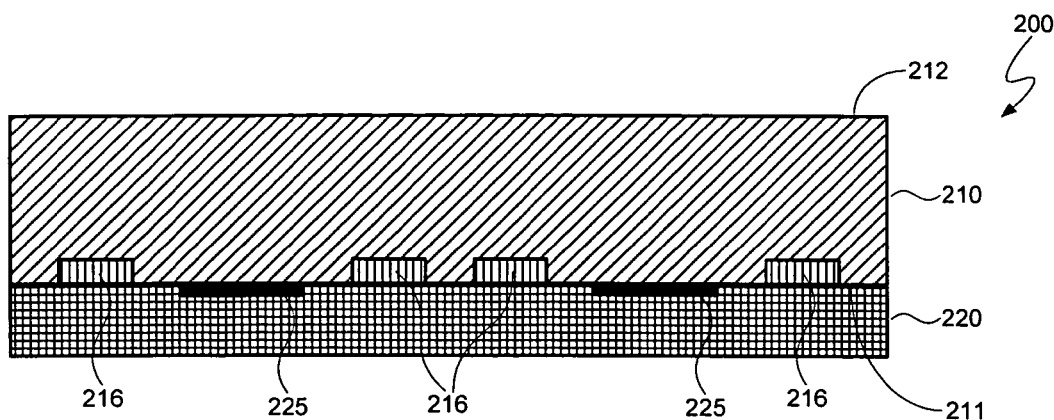
FIGS. 2A-2L are schematic diagrams illustrating embodiments of the method shown in FIG. 1.
Figure 2B:
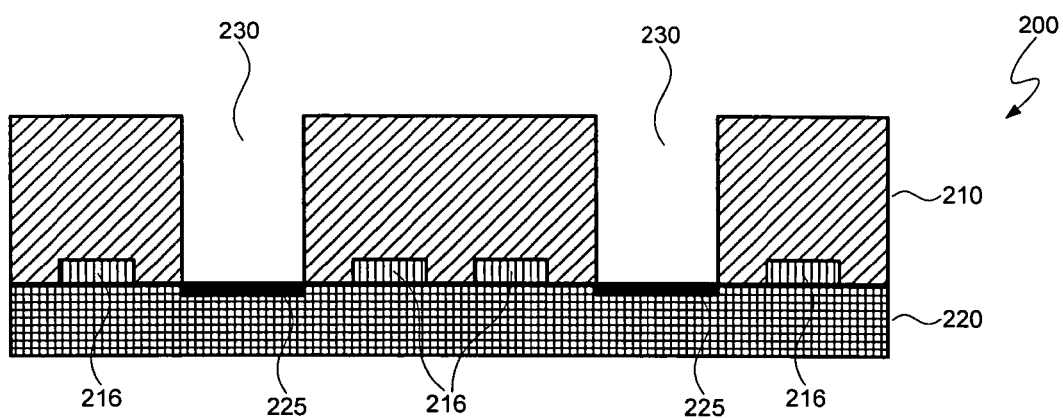

Referring to block 105 in FIG. 1, one or more vias are formed in a substrate. This is illustrated in FIGS. 2A and 2B. Referring first to FIG. 2A, a substrate 200 is shown, this substrate including a base layer 210. In one embodiment, the base layer 210 comprises silicon (Si); however, it should be understood that the substrate may comprise any other suitable material or combination of materials. The substrate's base layer 210 may be viewed as having a "front side" 211 and a "back side" 212 (the substrate 200 is depicted face down in the figures). It should be understood, however, that the labels "front side" and "back side" are arbitrary and, further, that the various surfaces of the substrate 200 may be referenced by any suitable convention. In one embodiment, circuitry has been formed on the base layer's front side 211, and this integrated circuitry may include a collection of circuit elements 216, such as transistors, diodes, capacitors, and resistors, as well as signal lines and other conductors that interconnect these various circuit elements.

In one embodiment, as shown in the figures, an interconnect structure 220 has been formed over the front side 211 of base layer 210. The interconnect structure 220 includes a number of levels of metallization, each level of metallization comprising a layer of dielectric material in which a number of conductors (e.g., traces) has been formed. Some of these conductors 225 are shown in FIGS. 2A-2L. The conductors in any given level of metallization are separated from the conductors of adjacent levels by the dielectric material, and the conductors of adjacent levels are electrically interconnected by conductive vias extending between these levels. The conductors and vias may comprise any suitable conductive material, such as copper (Cu), aluminum (Al), gold (Au), silver (Ag), or alloys of these and other metals. The dielectric material may comprise any suitable dielectric or insulating material, such as silicon dioxide ($SiO_2$), SiOF, carbon-doped oxide (CDO), a glass, or a polymer material.

In one embodiment, the substrate 200 comprises a semiconductor wafer upon which integrated circuitry for a number of die has been (or is to be) formed. The semiconductor wafer may comprise any suitable material, such as silicon (as noted above), silicon-on-insulator (SOI), gallium arsenide (GaAs), or other material or combination of materials. In one embodiment, the back side 212 of the wafer has been thinned prior to via formation. According to one embodiment, the thinned wafer has a thickness of between 25 μm and 150 μm.

Turning now to FIG. 2B, one or more vias 230 have been formed in the substrate 200. In one embodiment, at least some of the vias 230 extend from the substrate's back side 212 and through the base layer 210 to the front side 211, as shown in the figures. In a further embodiment, at least some of the vias 230 extend to one of the conductors 225 in interconnect structure 220, as also shown in the figures. According to one embodiment, the vias 230 comprise through-silicon vias. In yet another embodiment, the substrate 200 comprises one of two wafers that are to be bonded together to form a wafer stack, and the vias 230 may be used to form backside connections for the stacked wafers (and the stacked die that are to be cut from the bonded wafers). According to another embodiment, the vias 230 are to be used in the formation of a MEMS device on substrate 200.

Figure 2C:
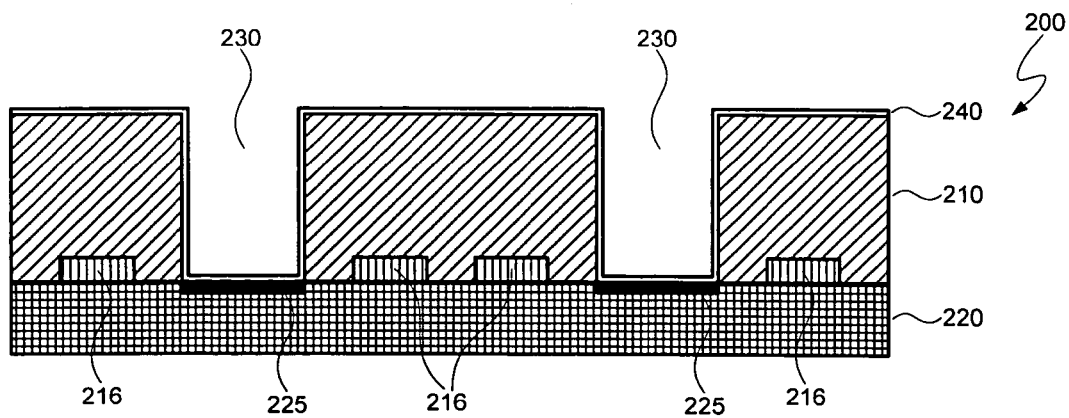

Returning to FIG. 1, an insulating layer (and/or passivation layer) may be deposited or formed over the substrate, as set forth in block 110. This is illustrated in FIG. 2C, where an insulating layer (and/or passivation layer) 240 has been deposited or formed over the back side 212 of substrate 200, as well as over the walls of vias 230. In one embodiment, the insulating layer 240 functions to electrically isolate the vias 230 from the base layer 210 (e.g., silicon). The insulating layer (and/or passivation layer) 240 may comprise any suitable material, such as $SiO_2$, $Si_3N_4$, or a polymer material. According to one embodiment, the insulating layer 240 is deposited using any suitable blanket deposition technique, such as chemical vapor deposition (CVD), etc. It should be understood that a single layer of material may function as both an insulating layer and a passivation layer, whereas in other embodiments separate insulating and passivation layers may be deposited. It should also be understood that, in some embodiments, an insulating layer (and/or passivation layer) is not deposited.

After via formation (and perhaps deposition of an insulating and/or passivation layer) a buffer material is deposited in the vias. The buffer material within each via will form a stress buffer collar between the base layer material (e.g., silicon) and a material (e.g., a conductive metal such as copper) that will be deposited in the vias. In one embodiment, the stress buffer collars can absorb thermally induced stresses that occur as a result of a CTE mismatch between the base layer (e.g., silicon) and the material deposited in the vias (e.g., copper).

In one embodiment, the buffer material is deposited by a spin-coating process that fills the vias, and holes are then formed through the buffer material within each via. This is illustrated by blocks 115 and 120 in FIG. 1, as well as FIGS. 2D and 2E. According to another embodiment, the buffer material is deposited by a conformal coating process, and the buffer material is removed from the bottom of each via. This is illustrated by blocks 125 and 130 in FIG. 1, as well as FIG. 2F and 2G. Each of these embodiments is now discussed in turn.

Figure 2D:
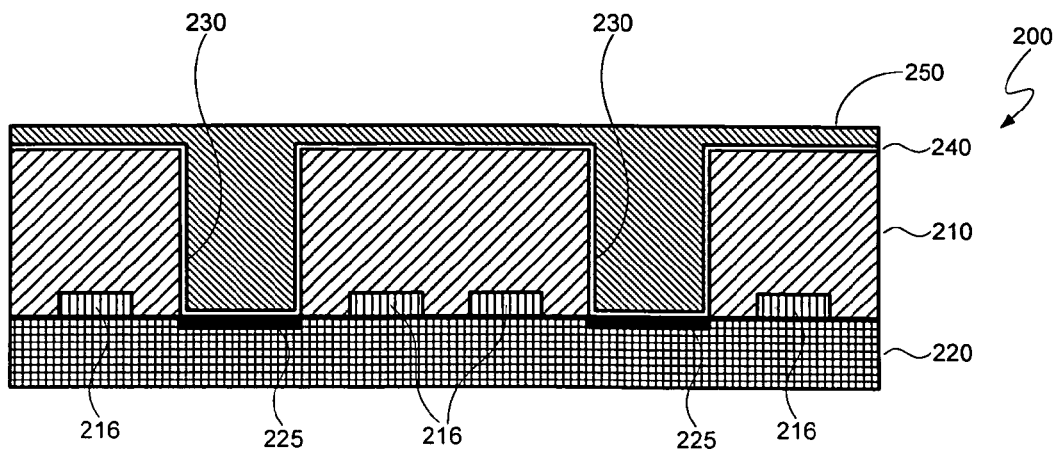
Figure 2E:
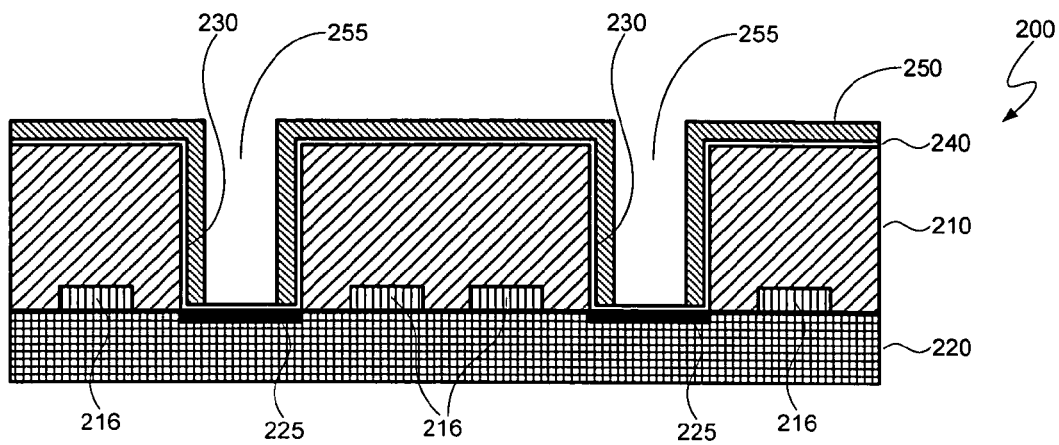

Referring to block 115 in FIG. 1, a buffer material is deposited over the substrate and within the vias using a spin-coating process (or other process) that fills the vias. This is illustrated in FIG. 2D, where a buffer material 250 has been deposited over the substrate 200. As set forth in block 120, holes are then formed through the buffer material. This is illustrated in FIG. 2E, where holes 255 have been formed through the buffer material 250 within vias 230. In one embodiment, the holes 255 are substantially concentric with vias 230. In a further embodiment, at least some of the holes 255 extend down to conductors 225 or to an insulating layer 240 that lies above the conductors 225. The holes may be formed using any suitable technique. In one embodiment, the holes 255 are formed by laser ablation, and in another embodiment the holes are formed using an etching process. In a further embodiment, where a lithographically patternable buffer material is used, the holes may be formed by using a lithographic process (e.g., photolithography, electron-beam lithography, etc.). In yet another embodiment, the holes may be formed by a milling process, such as ion milling or particle blasting.

Figure 2F:
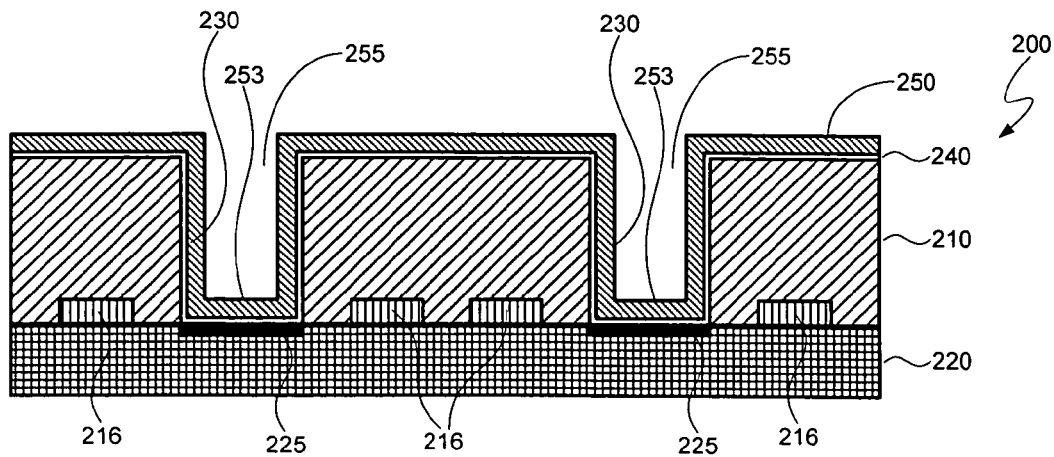

Referring to block 125 in FIG. 1, a conformal (or blanket) layer of buffer material is deposited over the substrate and within the vias. This is illustrated in FIG. 2F, where a conformal layer of the buffer material 250 has been formed over the substrate 200 and over the walls of the vias 230. Any suitable blanket deposition technique, such as CVD, may be used to deposit the buffer material layer 250. Note that a portion 253 of the buffer material layer 250 will be deposited at the bottom of vias 230. This buffer material 253 at the bottom of the vias may then be removed, as set forth in block 130. This is illustrated in FIG. 2G, where the buffer material has been removed from the bottom of vias 230, resulting in the formation of holes 255 surrounded by a layer of buffer material 250 and extending down to the insulating layer 240 or conductors 225.

Figure 2G:
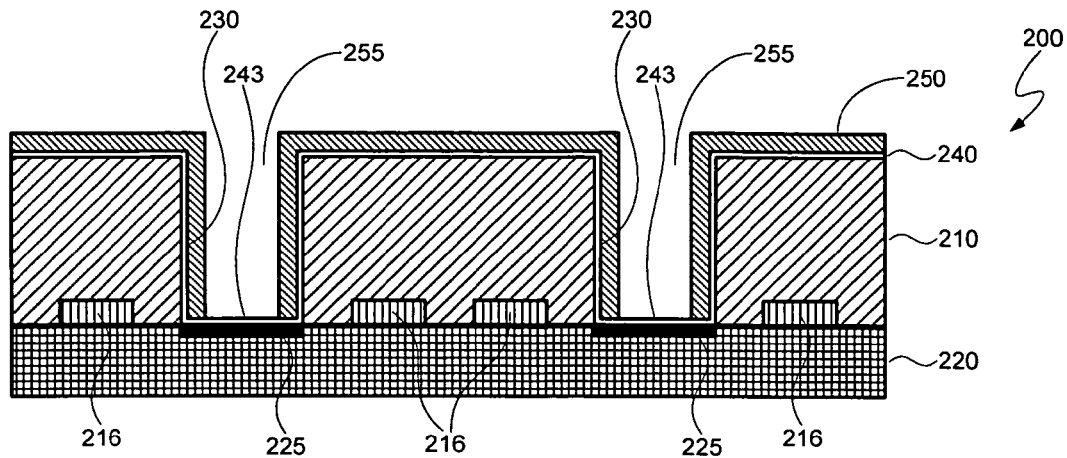

It should be noted that, irrespective of the manner in which the buffer layer 250 is deposited, the resulting structures will be similar (note that FIGS. 2E and 2G are similar), although in other embodiments the resulting structures may not be similar. Any of the above-described embodiments, as well as any other suitable process, may be employed to form the buffer layer 250. Thus, it should be understood that the disclosed embodiments of a process for forming the stress buffer collar are presented merely as illustrative embodiments and, further, that the disclosed stress buffer collars are not limited to any specific fabrication technique.

The buffer material 250 may comprise any suitable material. In one embodiment, the buffer material comprises a material capable of absorbing stresses that are due to a CTE mismatch between the material of base layer 110 (e.g., silicon) and a conductive material (e.g., copper), or other material, that is to be deposited in the vias 230. In one embodiment, the buffer material 250 has a CTE that is substantially the same as a CTE of the material (e.g., copper) to be deposited in the vias 230 (or holes 255). In another embodiment, the buffer material 250 has a CTE that is approximately equal to a mean of the CTE of the base layer material and the CTE of the material to be deposited in the vias 230. For example, where the base layer 210 comprises silicon and copper is to be deposited in the vias 230 (and holes 255), the buffer material 250 may comprise a material having a CTE within a range of approximately 9-11 ppm/° C.

In one embodiment, the buffer material 250 comprises a relatively compliant material (in comparison to the base layer and via materials). For example, silicon has a modulus of elasticity of about 47 GPa and copper has a modulus of elasticity of about 130 GPa. Should the base layer 210 comprise silicon and copper be deposited in the vias 230, the buffer material 250 may, in one embodiment, comprise a material having a modulus of elasticity in a range of between approximately 0.001 to 10 GPa. Utilizing a buffer material that is relatively compliant in comparison to the surrounding materials (e.g., silicon and copper) will, according to one embodiment, facilitate the absorption of stresses that develop due to different rates of thermal expansion between the surrounding materials. The use of a relatively compliant buffer layer may also serve other functions (e.g., serve as a stress relief, minimize points of stress concentration, prevent initiation and propagation of cracks, etc.).

In another embodiment, the buffer material 250 comprises a material that may be deposited using a spin-coating process. Buffer materials which may be spin-coated include, by way of example, silicones, acrylates, polymethylmethacrylate (PMMA), polyimide, benzocyclobuteeene (BCB), as well as various epoxies. In a further embodiment, the buffer material 250 comprises a material that may be deposited using a blanket deposition process (e.g., CVD). Buffer materials which may be deposited by CVD include, for example, polyparaxylelene (also referred to as parylene), fluorocarbons such as polytetrafluoroethylene (PTFE), and organosilicon materials such as polydimethylsiloxane (PDMS). Other suitable buffer materials include polyesters and polyolefins. According to yet another embodiment, the buffer material 250 comprises a material amenable to removal by laser ablation, and in yet a further embodiment the buffer material comprises a material amenable to removal by an etching process. In one embodiment, the buffer material 250 comprises a material that is lithographically patternable, and in a further embodiment the buffer material comprises a material amenable to removal by a milling process.

Figure 2H:
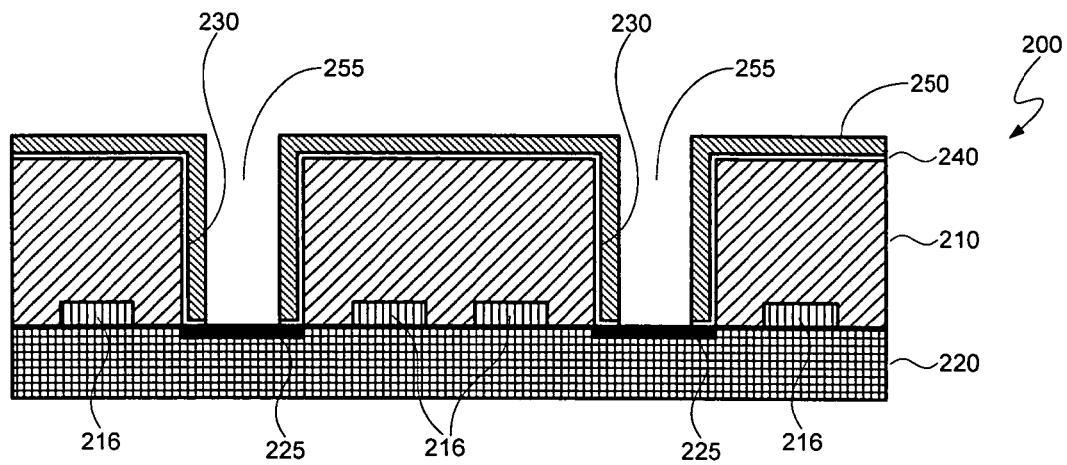

After deposition of the buffer material 250, a portion 243 of the insulating material 240 may remain at the bottom of holes 255. Thus, in one embodiment, the insulating layer (and/or passivation layer) is removed from the bottom of the vias, as set forth in block 135. This is illustrated in FIG. 2H, where the insulating material has been removed from the bottom of holes 255. In one embodiment, the insulating layer (and/or passivation layer) is removed using an etching process. According to another embodiment, after removal of the insulating layer (and/or passivation layer) from the bottom of holes 255, conductors 225 are exposed at the bottom of at least some of the holes 255. In yet another embodiment, no layer of insulating (and/or passivation) material was deposited, and this removal process is unnecessary.

Figure 2I:
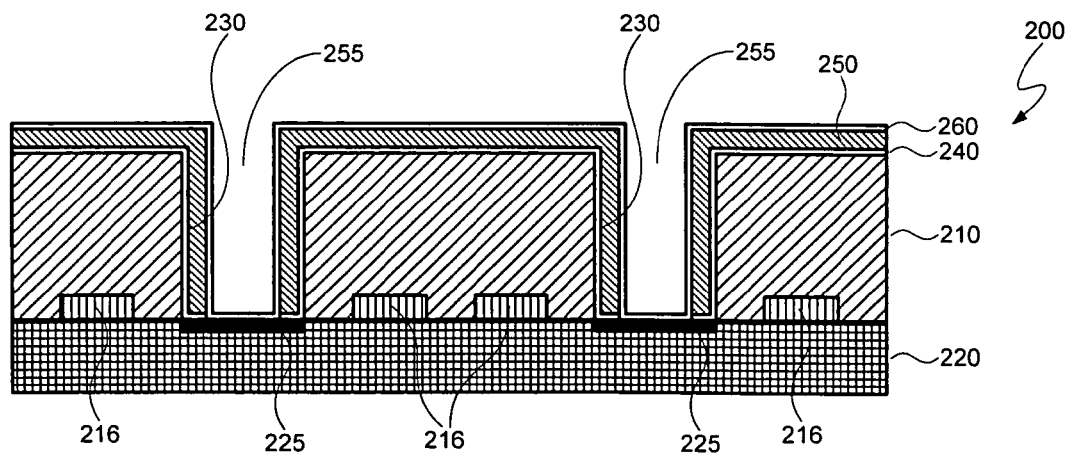

As set forth in block 140 a seed layer (and/or barrier layer) may be deposited on the substrate and within the vias. This is illustrated in FIG. 2I, where a seed layer (and/or barrier layer) 260 has been deposited or formed over the back side 212 of substrate 200, as well as over the walls of holes 255 (within vias 230). In one embodiment, the seed layer 260 comprises a material that enables the electroplating of a conductive metal within the holes 255 (and vias 230). The seed layer (and/or barrier layer) 260 may comprise any suitable material, such as Ta, TaN, Ti, TiN, Ni, NiV, Cr, Al, Cu, as well as alloys of these and/or other elements. According to one embodiment, the seed layer 260 is deposited using any suitable blanket deposition technique, such as sputtering, CVD, etc. It should be understood that a single layer of material may function as both a seed layer and a barrier layer, whereas in other embodiments separate seed and barrier layers may be deposited. It should also be understood that, in some embodiments, a seed layer (and/or barrier layer) is not deposited.

Figure 2J:
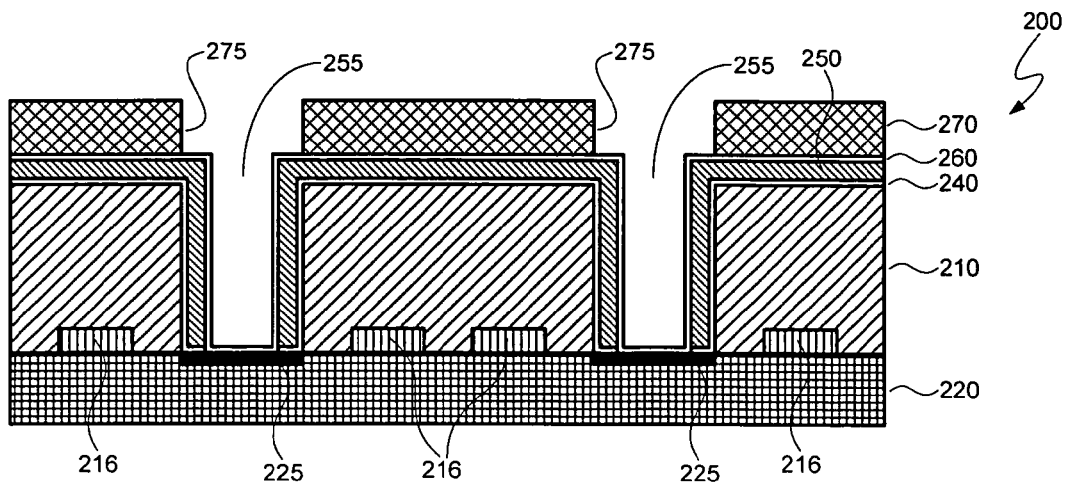

Referring to block 145 in FIG. 1, a layer of photoresist may be deposited and patterned. This is illustrated in FIG. 2J, where a layer of photoresist 270 has been deposited on the substrate 200 and patterned to form apertures 275 that expose the holes 255 (and vias 230). In one embodiment, the apertures 275 are larger than holes 255, and in another embodiment the apertures 275 are substantially concentric with the holes 255. In yet another embodiment, the apertures 275 may be used to form conductive bond pads, as will be discussed below. The photoresist material 270 may comprise any suitable photoresist material, and this material may be deposited using any suitable technique (e.g., a spin-coating process). Any suitable photolithography and etching processes may be used to pattern the photoresist layer 270. Also, it should be understood that, in some embodiments, a photoresist material is not deposited.

Figure 2K:
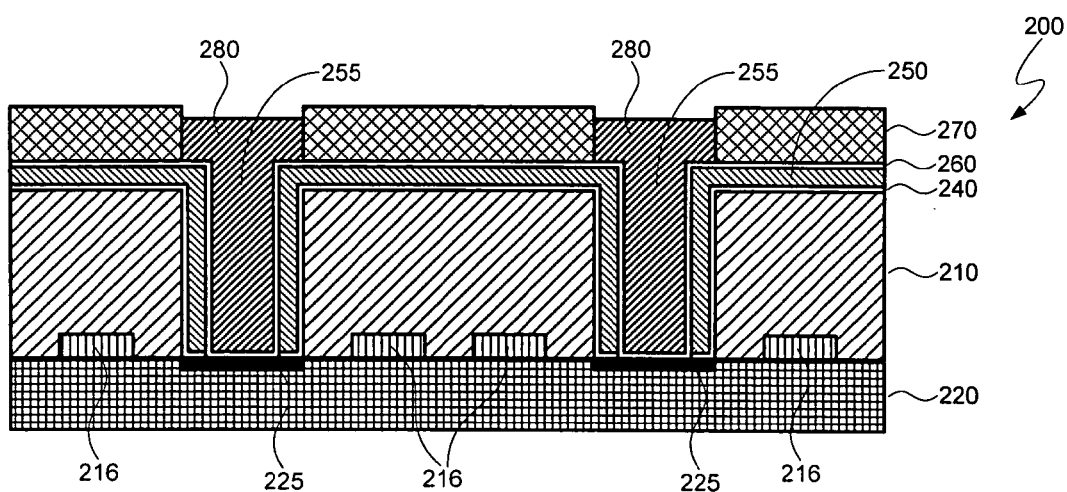

As set forth in block 150, a conductive material is deposited in the vias. This is illustrated in FIG. 2K, where a conductive material 280 has been deposited in the holes 255 (and vias 230). In one embodiment, the conductive material comprises a conductive metal such as copper or alloys of copper and other metals. Other suitable conductive metals include gold, silver, aluminum, as well as alloys of these and other metals. In a further embodiment, the material deposited in holes 255 (and vias 230) comprises a non-conductive material. The conductive material 280 may be deposited by any suitable process. In one embodiment, the conductive material is deposited using an electroplating process. In another embodiment, the conductive material is deposited by an electroless plating process. In a further embodiment, material is deposited in the vias using a blanket deposition technique, such as sputtering, evaporation, jet vapor deposition, spin-coating, screen or stencil printing, immersion, or a pick-and-place/reflow process (any of which may, perhaps, be followed by a planarization process, such as chemical-mechanical polishing (CMP) or an etching process).

Figure 2L:
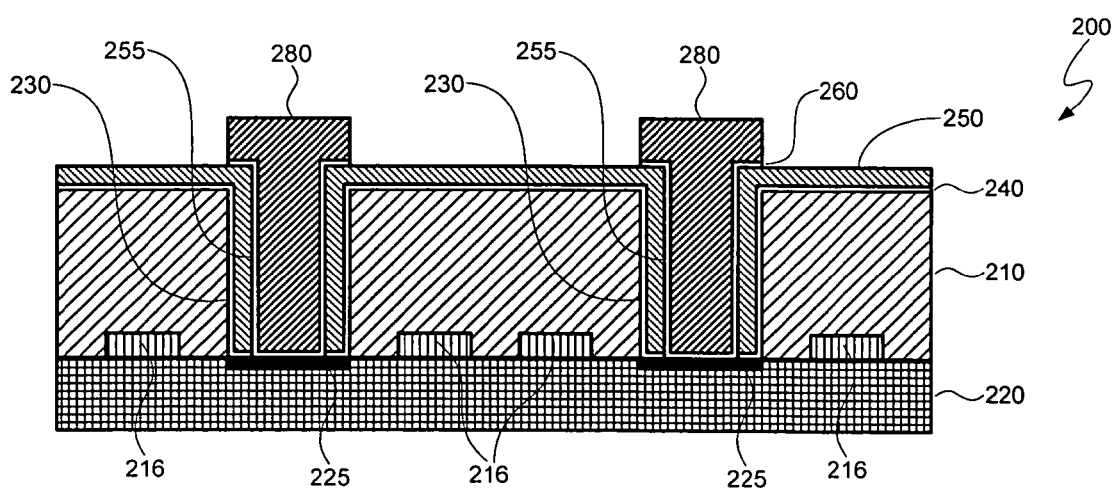

Referring to block 155, photoresist and exposed portions of the seed layer (and/or barrier layer) may be removed. This is illustrated in FIG. 2L, where the photoresist layer 270 has been removed, as have portions of the seed (and/or barrier) layer 260 (e.g., those portions that were underlying the photoresist). Any suitable process may be employed to remove the photoresist and seed (and/or barrier) layers. Again, in some embodiment, a seed (and/or barrier layer) and/or a photoresist layer may not be deposited, and this removal process may not be necessary.

Although the substrate 200 shown in FIGS. 2A through 2L includes just two vias 230—as well as only a small number of circuit elements 216—for ease of illustration, it should be understood that the disclosed embodiments of a method of forming vias having stress buffer collars are typically performed at the wafer level and that such a wafer may include integrated circuitry for a number of die. This is further illustrated in FIG. 3 which shows a plan view of a wafer 300.

Figure 3:
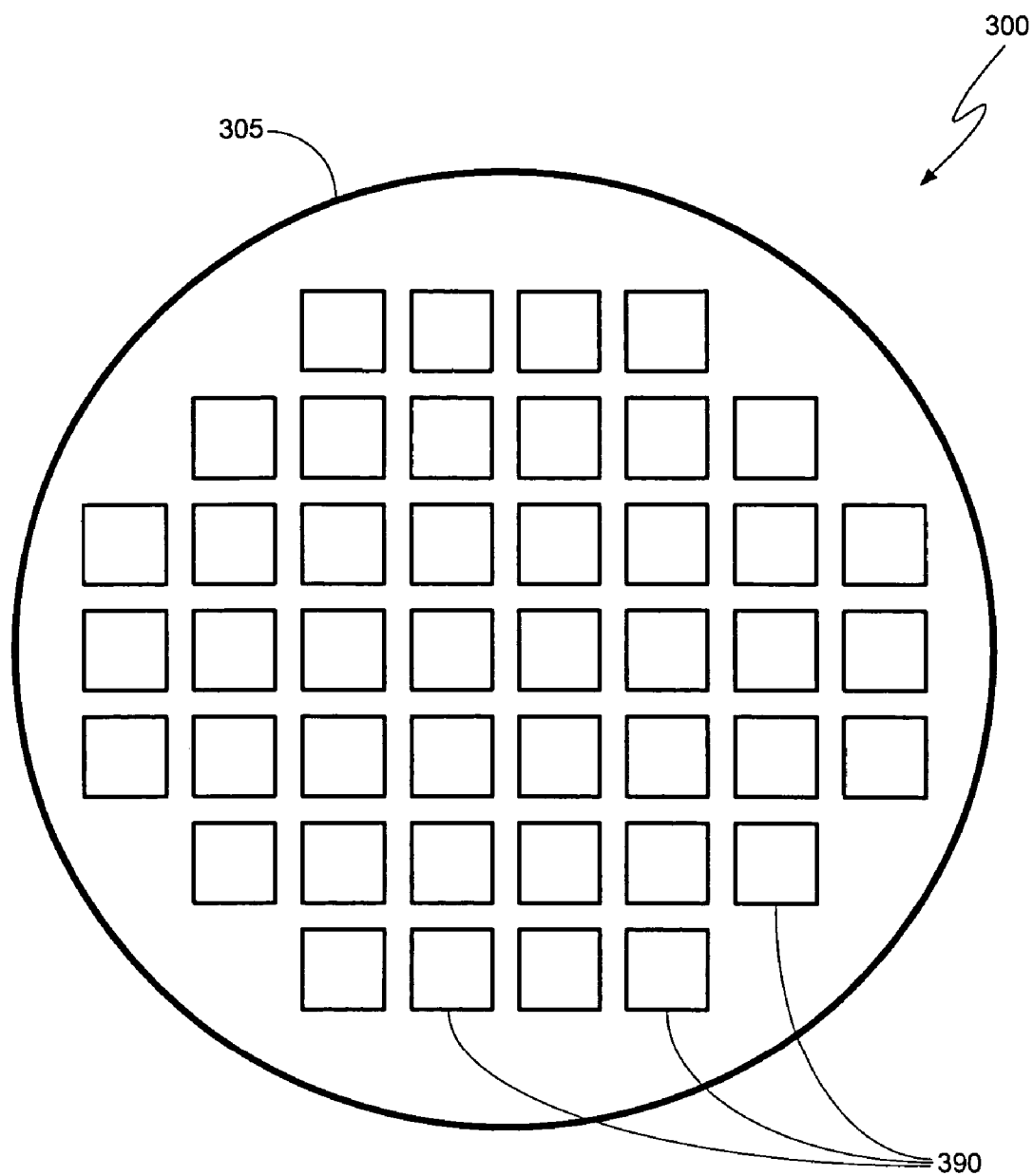
FIG. 3 is a schematic diagram illustrating an embodiment of a wafer upon which vias having stress buffer collars may be formed according to the disclosed embodiments.

Referring to FIG. 3, the wafer 300 comprises a substrate 305 (e.g., Si, SOI, GaAs, etc.) upon which integrated circuitry for a number of die 390 has been formed, and wafer 300 is ultimately cut into these separate die 390. According to one embodiment, the substrate 305 includes vias having stress buffer collars formed according to any of the disclosed embodiments (e.g., in one embodiment, the substrate 305 may be the same or similar to the substrate 200). In practice, each of the die 390 may include hundreds of vias having stress buffer collars, and the wafer 300 as a whole may include thousands of such vias. Further, each die 390 may include hundreds of millions of circuit elements (e.g., transistors, etc.). Also, in yet another embodiment, the wafer 300 may be bonded to a second wafer to form a wafer stack, and the wafer stack is ultimately cut into a number of stacked die, each stacked die including perhaps hundreds of vias having stress buffer collars. In addition, it should again be emphasized that the disclosed embodiments are not limited to the formation of vias in silicon and that the disclosed embodiments may be applied to any suitable substrate material or combination of materials.

Figure 4:
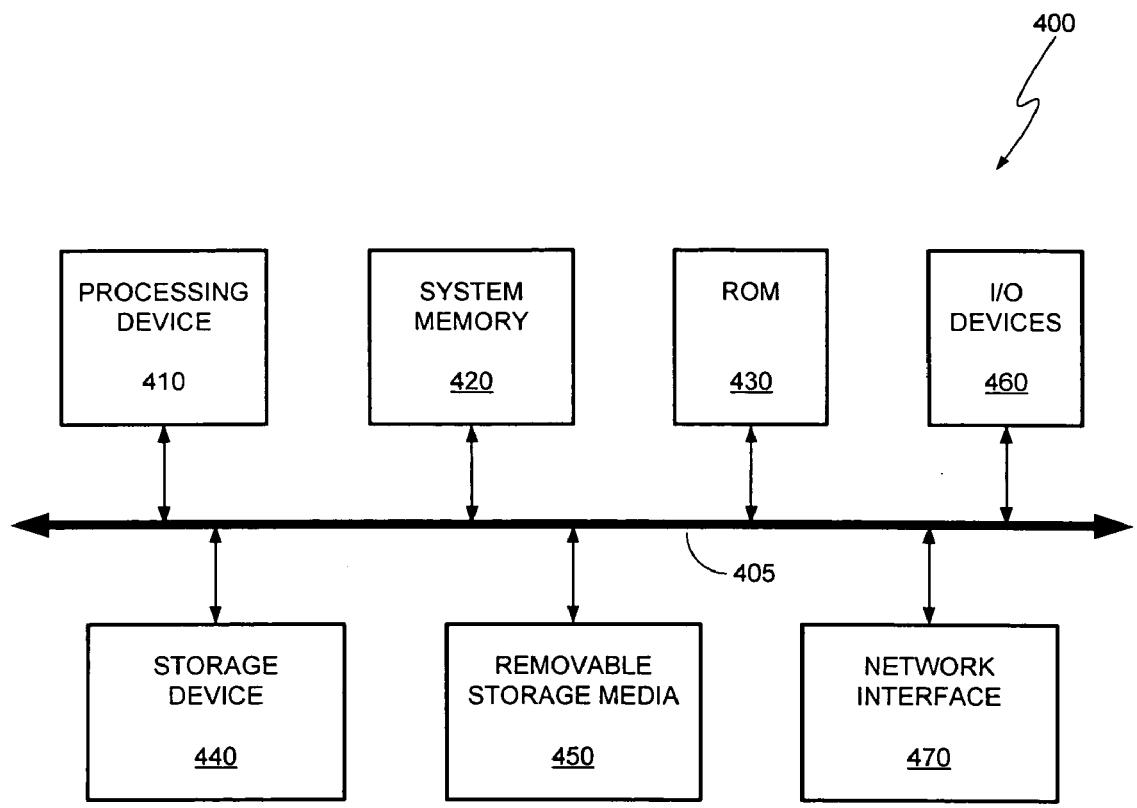
FIG. 4 is a schematic diagram illustrating an embodiment of a computer system, which may include a component formed according to the disclosed embodiments.

Referring to FIG. 4, illustrated is an embodiment of a computer system 400. Computer system 400 includes a bus 405 to which various components are coupled. Bus 405 is intended to represent a collection of one or more buses—e.g., a system bus, a Peripheral Component Interface (PCI) bus, a Small Computer System Interface (SCSI) bus, etc.—that interconnect the components of system 400. Representation of these buses as a single bus 405 is provided for ease of understanding, and it should be understood that the system 400 is not so limited. Those of ordinary skill in the art will appreciate that the computer system 400 may have any suitable bus architecture and may include any number and combination of buses.

Coupled with bus 405 is a processing device (or devices) 410. The processing device 410 may comprise any suitable processing device or system, including a microprocessor, a network processor, an application specific integrated circuit (ASIC), or a field programmable gate array (FPGA), or similar device. It should be understood that, although FIG. 4 shows a single processing device 410, the computer system 400 may include two or more processing devices.

Computer system 400 also includes system memory 420 coupled with bus 405, the system memory 420 comprising, for example, any suitable type and number of memories, such as static random access memory (SRAM), dynamic random access memory (DRAM), synchronous DRAM (SDRAM), or double data rate DRAM (DDRDRAM). During operation of computer system 400, an operating system and other applications may be resident in the system memory 420.

The computer system 400 may further include a read-only memory (ROM) 430 coupled with the bus 405. The ROM 430 may store instructions for processing device 610. The system 400 may also include a storage device (or devices) 440 coupled with the bus 405. The storage device 440 comprises any suitable non-volatile memory, such as, for example, a hard disk drive. The operating system and other programs may be stored in the storage device 440. Further, a device 450 for accessing removable storage media (e.g., a floppy disk drive or a CD ROM drive) may be coupled with bus 405.

The computer system 400 may also include one or more I/O (Input/Output) devices 460 coupled with the bus 405. Common input devices include keyboards, pointing devices such as a mouse, as well as other data entry devices, whereas common output devices include video displays, printing devices, and audio output devices. It will be appreciated that these are but a few examples of the types of I/O devices that may be coupled with the computer system 400.

The computer system 400 may further comprise a network interface 470 coupled with bus 405. The network interface 470 comprises any suitable hardware, software, or combination of hardware and software that is capable of coupling the system 400 with a network (e.g., a network interface card). The network interface 470 may establish a link with the network (or networks) over any suitable medium—e.g., wireless, copper wire, fiber optic, or a combination thereof—supporting the exchange of information via any suitable protocol—e.g., TCP/IP (Transmission Control Protocol/Internet Protocol), HTTP (Hyper-Text Transmission Protocol), as well as others.

It should be understood that the computer system 400 illustrated in FIG. 4 is intended to represent an exemplary embodiment of such a system and, further, that this system may include many additional components, which have been omitted for clarity and ease of understanding. By way of example, the system 400 may include a DMA (direct memory access) controller, a chip set associated with the processing device 410, additional memory (e.g., a cache memory), as well as additional signal lines and buses. Also, it should be understood that the computer system 400 may not include all of the components shown in FIG. 4. The computer system 400 may comprise any type of computing device, such as a desktop computer, a laptop computer, a server, a hand-held computing device (e.g., a personal digital assistant, or PDA), a wireless communication device, an entertainment system, etc.

In one embodiment, the computer system 400 includes a component including one or more vias having stress buffer collars. For example, the processing device 410 of system 400 may include a die including vias with stress buffer collars. However, it should be understood that other components of system 400 (e.g., network interface 470, etc.) may include a device including vias with stress buffer collars.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A method comprising:
   forming a via in a substrate, the via having a sidewall and a bottom, the substrate comprised of a first material;
   depositing a layer of a buffer material in the via such that the layer of the buffer material completely fills the via;
   forming a hole in the buffer material, the hole extending to proximate the bottom of the via; and
   depositing a second material to completely fill the second material in the hole in the buffer material within the via, wherein the buffer material is capable of absorbing stress due to a thermal expansion mismatch between the first and second materials wherein the first material comprises silicon and the second material comprises copper.

2. The method of claim 1, wherein a coefficient of thermal expansion (CTE) of the buffer material is approximately equal to a CTE of copper.

3. The method of claim 1, wherein a CTE of the buffer material is approximately equal to a mean of a CTE of silicon and a CTE of copper.

4. The method of claim 1, wherein the buffer material comprises a relatively compliant material in comparison to silicon and copper.

5. The method of claim 1, wherein the buffer material comprises a material selected from a group including silicones, acrylates, polyimides, benzocyclobutene (BCB), parylenes, fluorocarbons, polyolefins, polyesters, and epoxies.

6. The method of claim 1, wherein the substrate comprises a silicon wafer, the silicon wafer having circuitry formed on a front side and an opposing back side, and wherein forming a via comprises forming a via from the wafer backside, the via extending to a conductor proximate the wafer front side.

7. The method of claim 1, wherein the hole is formed using a process selected from a group consisting of laser ablation, etching, lithography, and milling.

8. The method of claim 1, wherein the layer of buffer material is deposited using a spin-coating process.

9. The method of claim 1, wherein the layer of buffer material is deposited using a chemical-vapor deposition (CVD) process.

10. The method of claim 1, further comprising depositing at least one of an insulating layer and a passivation layer in the via prior to deposition of the buffer material.

11. The method of claim 10, further comprising removing a portion of the at least one layer from a bottom of the via.

12. The method of claim 1, further comprising depositing at least one of a seed layer and a barrier layer over the buffer material prior to deposition of the second material.

13. A method comprising:
   forming a via in a substrate, the via having a sidewall and a bottom, the substrate comprised of a first material having a first coefficient of thermal expansion (CTE);
   depositing a second material in the via such that the second material completely fills the via, the second material having a second CTE;
   forming a hole in the second material the hole extending to proximate the bottom of the via; and
   depositing a third material to completely fill the third material in the hole in the second material within the via, the third material having a third CTE;

wherein the second CTE is in a range between the first CTE and the third CTE wherein the first material comprises silicon and the third material comprises copper.

14. The method of claim 13, wherein the second CTE is approximately equal to the third CTE.

15. The method of claim 13, wherein the second CTE is approximately equal to a mean of the first CTE and the third CTE.

16. The method of claim 13, wherein second material comprises a material selected from a group including silicones, acrylates, polyimides, benzocyclobutene (BCB), parylenes, fluorocarbons, polyolefins, polyesters, and epoxies.

17. The method of claim 13, wherein the second material comprises a relatively compliant material in comparison to first and third materials.

18. A method comprising:

forming a via in a substrate, the via having a sidewall and a bottom the substrate comprised of a first material;

depositing a layer of a buffer material in the via such that the layer of the buffer material completely fills the via;

forming a hole in the buffer material, the hole extending to proximate the bottom of the via; and depositing a second material to completely fill the second material in the hole in the buffer material;

wherein the buffer material comprises a relatively compliant material in comparison to the first and second materials.

19. The method of claim 18, wherein each of the first and second materials has a modulus of elasticity greater than approximately 40 GPa.

20. The method of claim 19, wherein the buffer material has a modulus of elasticity less than approximately 10 GPa.

21. The method of claim 20, wherein the buffer material has a modulus of elasticity greater than approximately 0.001 GPa.

22. The method of claim 18, wherein the buffer material has a coefficient of thermal expansion (CTE) in a range between approximately a CTE of the first material and a CTE of the second material.

* * * * *